United States Patent
Shin et al.

(10) Patent No.: US 6,713,336 B2
(45) Date of Patent: Mar. 30, 2004

(54) FLASH MEMORY DEVICE AND METHOD FOR FABRICATING THE SAME

(75) Inventors: Sung Hun Shin, Kyoungki-do (KR); Jae Doo Eom, Kyoungki-do (KR)

(73) Assignee: Hynix Semiconductor Inc., Ich'on (KR)

(*) Notice: Subject to any disclaimer, the term of this patent is extended or adjusted under 35 U.S.C. 154(b) by 0 days.

(21) Appl. No.: 10/374,131

(22) Filed: Feb. 27, 2003

(65) Prior Publication Data

US 2003/0164518 A1 Sep. 4, 2003

Related U.S. Application Data

(62) Division of application No. 10/004,866, filed on Dec. 7, 2001.

(30) Foreign Application Priority Data

Sep. 20, 2001 (KR) .......................................... 2001-58141

(51) Int. Cl.[7] .......................................... H01L 21/8238
(52) U.S. Cl. ...................... 438/201; 438/211; 438/257; 438/260; 438/262; 438/266
(58) Field of Search ................................ 257/298, 314, 257/315, 316, 317, 318, 319, 320, 321, 322; 438/201, 211, 257, 260, 262, 266, 270, 263, 264, 594

(56) References Cited

U.S. PATENT DOCUMENTS

| | | | | |
|---|---|---|---|---|
| 5,495,441 A | * | 2/1996 | Hong | 365/185.01 |
| 5,680,345 A | * | 10/1997 | Hsu et al. | 257/315 |
| 5,751,038 A | * | 5/1998 | Mukherjee | 257/316 |
| 5,936,274 A | | 8/1999 | Forbes et al. | |
| 5,973,356 A | | 10/1999 | Noble et al. | |
| 6,002,151 A | * | 12/1999 | Liu et al. | 257/316 |
| 6,087,222 A | * | 7/2000 | Jung Lin et al. | 438/259 |
| 6,087,696 A | | 7/2000 | Li et al. | |
| 6,143,636 A | | 11/2000 | Forbes et al. | |
| 6,172,395 B1 | * | 1/2001 | Chen et al. | 257/315 |
| 6,185,122 B1 | | 2/2001 | Johnson et al. | |
| 6,200,856 B1 | | 3/2001 | Chen | |
| 6,239,465 B1 | * | 5/2001 | Nakagawa | 257/314 |
| 6,259,134 B1 | | 7/2001 | Amaratunga et al. | |
| 6,368,911 B2 | * | 4/2002 | Fu | 438/248 |
| 6,437,397 B1 | * | 8/2002 | Lin et al. | 257/321 |
| 6,462,375 B1 | * | 10/2002 | Wu | 257/316 |
| 6,498,064 B2 | * | 12/2002 | Tseng | 438/257 |
| 2002/0000602 A1 | * | 1/2002 | Lee | 257/314 |
| 2002/0033517 A1 | * | 3/2002 | Lojek | 257/510 |

* cited by examiner

Primary Examiner—Eddie Lee
Assistant Examiner—Quang Vu
(74) Attorney, Agent, or Firm—Jacobson Holman PLLC

(57) ABSTRACT

A flash memory device having improved gate capacitive coupling ratio between a floating gate and a control gate and a fabrication method therefor. The disclosed flash memory device comprises a semiconductor substrate having a first trench with a width including an active region and an isolation region at either side thereof; an isolation layer formed on the isolation regions of the first trench; a second trench in the first trench defined by the isolation layer and exposing only the active region; a groove-shaped floating gate formed on the surface of the second trench and having a tunnel oxide layer on the lower part thereof; a control gate formed on the floating gate and having a gate insulating layer on the lower part thereof; a source region and a drain region formed in the substrate at both sides of the floating gate; and metal wirings formed to be in contact with the source and drain regions, respectively, through the isolation layer on the substrate.

9 Claims, 6 Drawing Sheets

FLASH MEMORY DEVICE AND METHOD FOR FABRICATING THE SAME

This is a divisional application of prior application Ser. No. 10/004,866 filed Dec. 7, 2001.

BACKGROUND OF THE INVENTION

1. Field of the Invention

The present invention relates to flash memory devices and, more particularly, to a flash memory device and fabrication method therefor having improved gate capacitive coupling ratio between the floating and control gates.

2. Description of the Related Art

A flash memory device is manufactured by taking advantage of EPROM, having programming and erasing properties, and EEPROM which has electrically ensuring programming and erasing properties.

Flash memory devices realize one bit memory with one transistor and electrically perform programming and erasing. The programming and erasing are performed using a combined power supply of 12V/5V and particularly, programming is performed using hot electron by external high voltage and erasing is performed using F-N (Fowler-Nordheim) tunneling.

The structure and fabrication method of a conventional flash memory device will be described in more detail with reference to the accompanying drawings.

FIG. 1 is a top view of a conventional flash memory device and FIGS. 2 and 3 are cross sectional views taken along the line A-A' and the line B-B' of FIG. 1, respectively. As shown, the conventional flash memory device includes a substrate 1, an isolation layer 2, a tunnel oxide layer 3, a floating gate 4, an ONO layer 5, a control gate 6, a polysilicon layer 6a, a tungsten silicide layer 6b, a TEOS oxide layer 6c, a nitride layer 6d and an anti-reflective coating layer 6e.

Referring to FIGS. 1 to 3, control gates 6 having line form are arranged separately on the substrate 1, wherein each control gate has a structure in which the polysilicon layer 6a, tungsten silicide layer 6b, TEOS oxide layer 6c, nitride layer 6d and anti-reflective coating layer 6e are stacked. A source region 8 and a drain region 9 are formed at both sides of the control gate 6 in the substrate 1. A floating gate 4 is formed on an active region defined by an isolation layer 2 below the control gate 6, with a tunnel oxide layer 3 being interposed.

The fabrication method of a conventional flash memory device will now be described in the following.

Trench type isolation layers are formed in a predetermined position of a semiconductor substrate by Shallow Trench Isolation (STI) process. A thin tunnel oxide layer and a first polysilicon layer are sequentially formed on the surface of the substrate, and then patterned in a line form extending in one direction on the active region of the substrate defined by the isolation layers.

An ONO layer, a second polysilicon layer, a tungsten silicide layer, a TEOS oxide layer, a nitride layer and an anti-reflective coating layer are sequentially deposited on the resulting structure, and then a control gate of line form is obtained by patterning the layers to be at right angles to the patterned first polysilicon layer Self Align Etch (SAE) process is performed to remove the ONO layer, the first polysilicon layer and the tunnel oxide layer formed on the source/drain predetermined region, thereby obtaining a floating gate. Then, source and drain regions are formed in the active region at both sides of the control gate and succeeding processes including a metal wiring process are performed.

In the conventional flash memory device, the contact area between the floating gate and the control gate is small, since the floating gate and the control gate are arranged in a simple stack structure. Therefore, there is a limitation in the prior art as to the ability to increase cell gate capacitive coupling ratio and improve programming and erasing properties.

FIGS. 4 and 5 illustrate gate capacitive coupling ratio in a flash memory device. In the drawings, Vcg indicates control gate voltage, Vf indicates floating gate voltage, Vb indicates substrate voltage, Vs indicates source voltage, Cipo indicates floating gate-control gate capacitance, Cgb indicates gate-substrate capacitance, Cgd indicates gate-drain capacitance and Cgs indicates gate-source capacitance.

According to FIGS. 4 and 5, when Vd is 0, Vf is calculated as shown in formula ①.

$$Vf = \frac{Cipo}{Cipo + Cgs + Cgd + Cgb} \times Vcg \qquad ①$$

When Vcg is 0, Vf is calculated as shown in formula ②.

$$Vf = \frac{Cgd}{Cipo + Cgs + Cgd + Cgb} \times Vd \qquad ②$$

And, Vf is obtained by the sum of ① and ② according to the principle of superposition as shown in formula ③.

$$Vf = \frac{Cipo}{Cipo + Cgs + Cgd + Cgb} \times Vcg + \frac{Cgd}{Cipo + Cgs + Cgd + Cgb} \times Vd \qquad ③$$

In the formulas, if the Cipo is increased the Vf is also increased accordingly. The Cipo is calculated as shown in formula ④.

$$C = \frac{A}{L} \qquad ④$$

(A: Area, L: Length)

As a result, in the formula ③, if the contact area of the floating gate and control gate is increased, Vf is increased accordingly.

However, the conventional gate structure has a limited capacity for increasing the contact area and improving gate capacitive coupling ratio, due to the fact that the floating gate and the control gate are arranged in a simple stack structure.

SUMMARY OF THE INVENTION

Therefore, the present invention has been made to solve the above problems and one object of the present invention is to provide a flash memory device having an increased contact area between the floating gate and control gate and a fabrication method therefor.

Another object of the present invention is to provide a flash memory device having improved programming and erasing properties by improving gate capacitive coupling ratio and a fabrication method therefor.

In order to accomplish the above objects, the present invention comprises a semiconductor substrate having a first trench with a width including an active region and an isolation region at either side thereof; an isolation layer formed on the isolation regions of the first trench; a second trench in the first trench defined by the isolation layer and for exposing only the active region; a groove-shaped floating gate formed on the surface of the second trench and having a tunnel oxide layer on the lower part thereof; a control gate formed on the floating gate and having a gate insulating layer on the lower part thereof; a source region and a drain region formed in the substrate at both sides of the floating gate; and metal wirings formed to be in contact with the source and drain regions, respectively, through the isolation layer on the substrate.

The present invention further includes a fabrication method for a flash memory device comprising the steps of forming a first trench having a width including an active region and an isolation region at both sides thereof on a predetermined position of a semiconductor substrate; filling up a sacrificial layer in the first trench; patterning the sacrificial layer to expose the isolation regions of the first trench; forming a source region and a drain region by implanting impurity ions of a predetermined conductive type into the exposed first trench region; forming an isolation layer by filling up an insulating layer in the exposed first trench region; removing the patterned sacrificial layer to form a second trench exposing the active region; forming a tunnel oxide layer and a floating gate sequentially on the surface of the second trench; forming a control gate with a gate insulating layer interposed on the floating gate and the substrate; and forming metal wirings to be in contact with the source and the drain regions, respectively, through the isolation layer on the substrate.

The above objects and other features and advantages of the present invention will become more apparent after reading the following detailed description when taken in conjunction with the drawings.

DETAILED DESCRIPTION OF THE INVENTION

Figure 6:
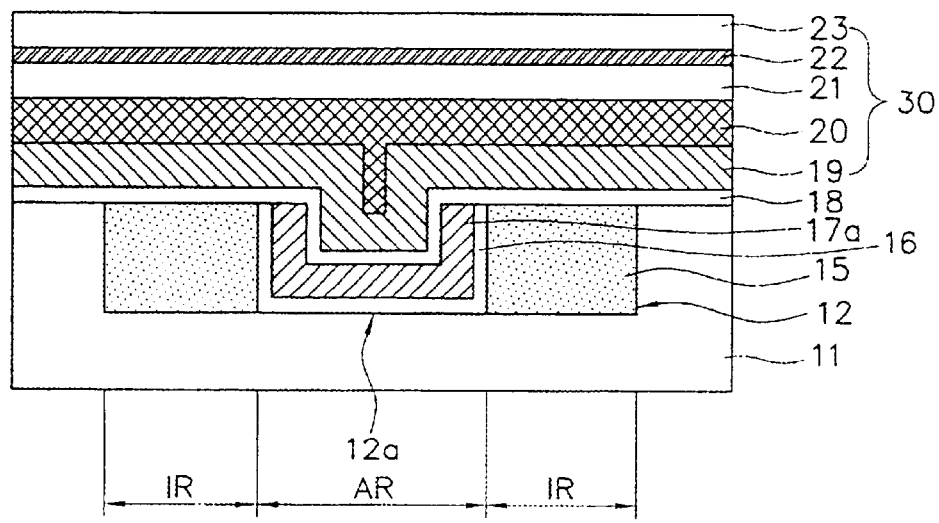
FIGS. 6 and 7 are cross-sectional views showing a flash memory device according to an embodiment of the present invention.
Figure 7:
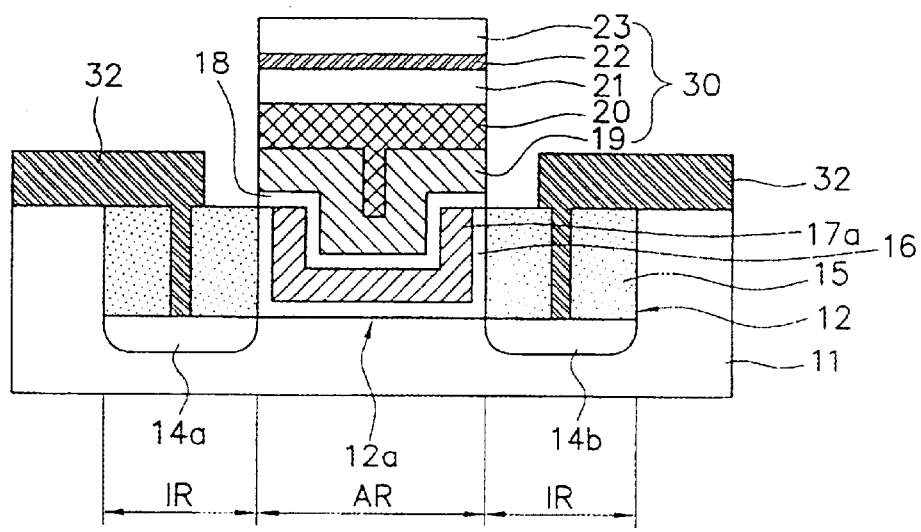

Referring to FIGS. 6 and 7, a first trench 12 is formed to have a width including that of an active region AR and isolation regions IR at both sides thereof on a predetermined position of a semiconductor substrate 11. An isolation layer 15 is formed on isolation regions IR in the first trench 12. Source and drain regions 14a, 14b are formed below the isolation layer 15. A floating gate 17a is formed in the shape of a groove on the surface of second trench 12a reduced by the isolation layer 15 with a tunnel oxide layer 16 being interposed on the lower part thereof. A control gate 30 is formed on the floating gate 17a with an ONO layer 18 being interposed on the lower part thereof.

The control gate 30 has a stacked structure comprising a polysilicon layer 19 formed on the surface of the floating gate 17a and partially filling the groove, a tungsten silicide layer 20 formed to fill up the groove on the polysilicon layer 19, and a TEOS oxide layer 21, a nitride layer 22 and an anti-reflective coating layer 23 sequentially stacked on the tungsten silicide layer 20.

In the gate structure according to the present invention as described above, the contact area between the floating gate 17a and the control gate 30 is increased, since the floating gate 17a has the shape of a groove. Therefore, Cipo between the floating gate 17a and the control gate 30 is increased, so that Vf is increased as based on the above formulas 1, 2, 3 and 4.

As a result, since the flash memory device according to the present invention has improved cell gate capacitive ratio, the device may be operated with low voltage, thereby having improved programming and erasing properties.

Figure 1:
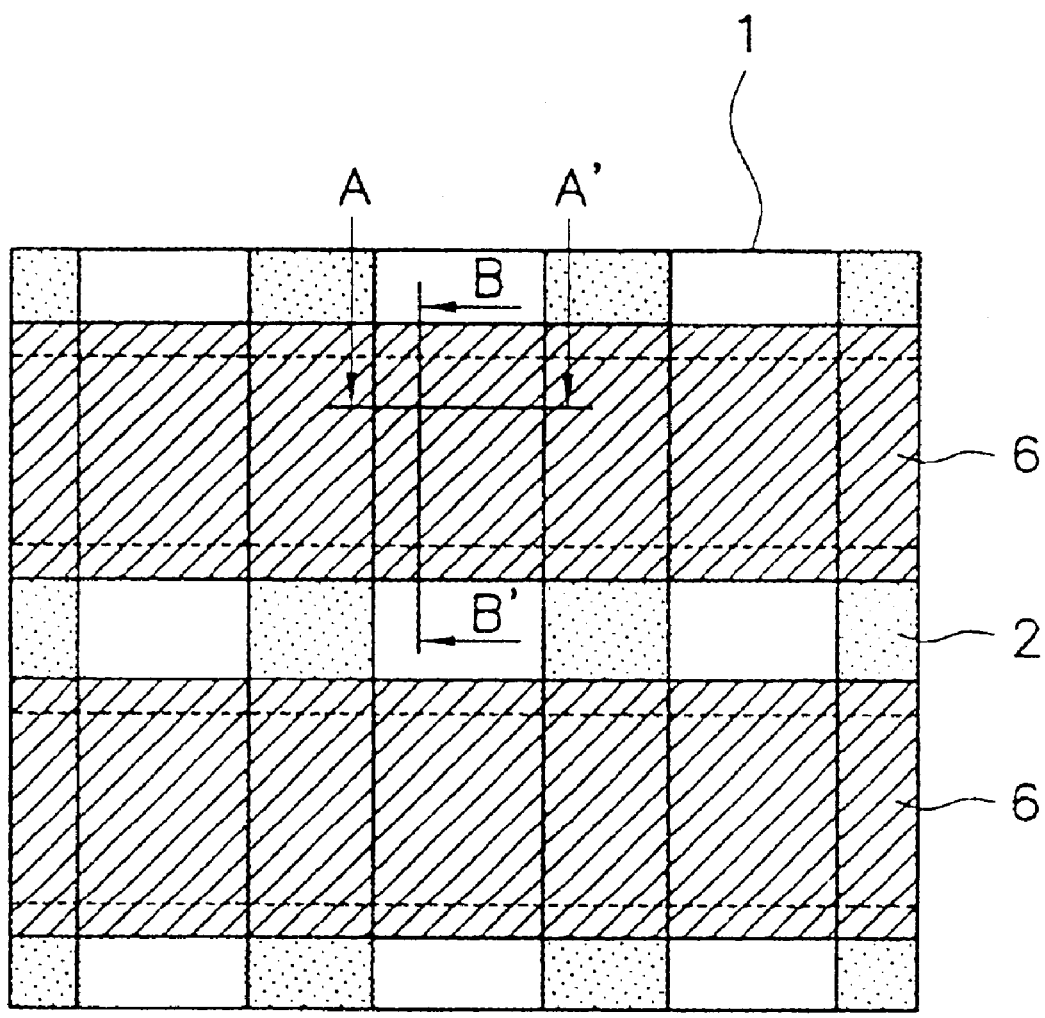
FIG. 1 is a top view of conventional flash memory device.
Figure 2:
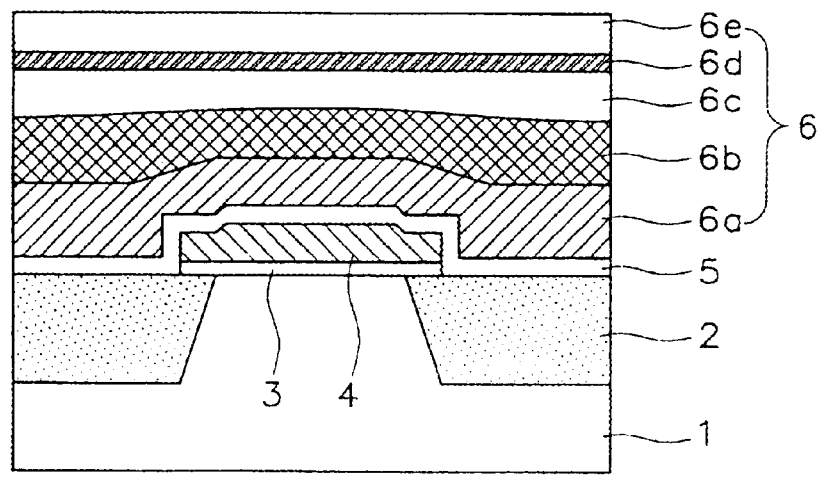
FIG. 2 is a cross sectional view taken along the line A-A' of FIG. 1.
Figure 3:
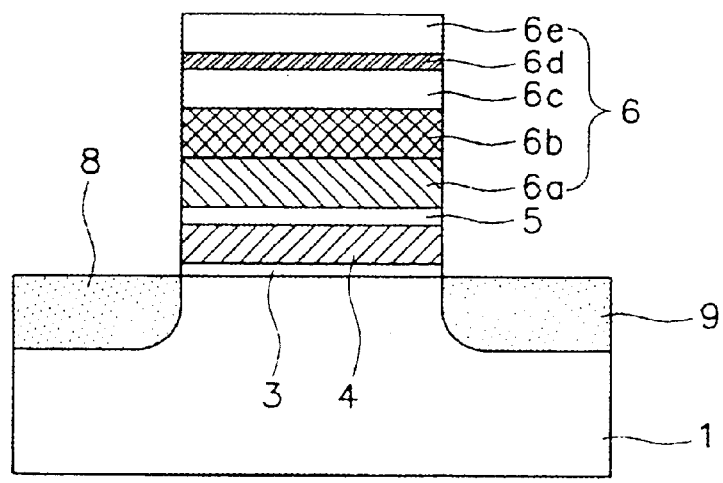
FIG. 3 is a cross sectional view taken along the line B-B' of FIG. 1.
Figure 4:
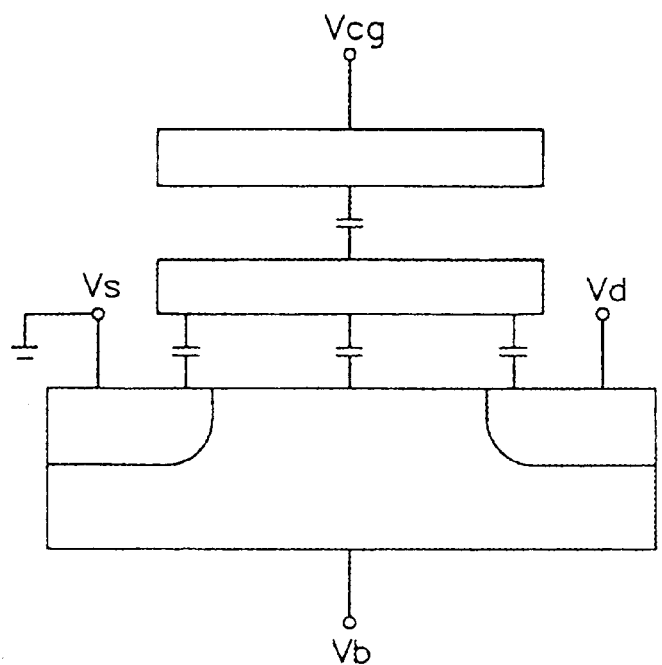
FIGS. 4 and 5 are drawings explaining gate capacitive coupling ratio.
Figure 5:
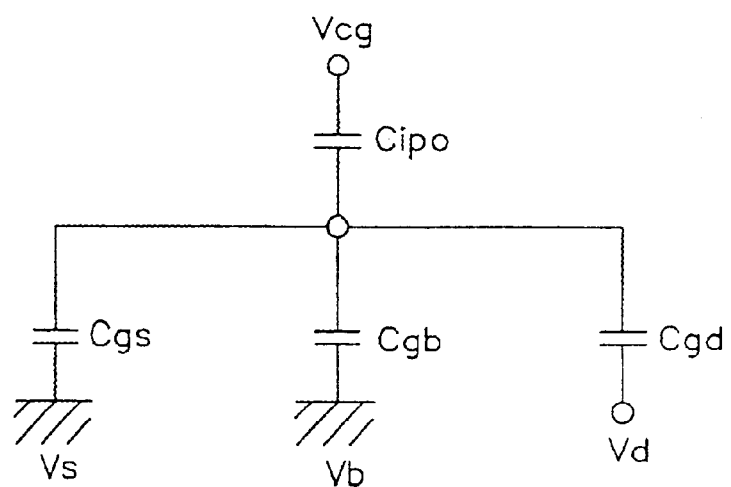

FIGS. 8A to 8D are drawings showing a fabrication method for a flash memory device according to an embodiment of the present invention. The drawings are shown as along the B-B' line of FIG. 1.

Figure 8A:
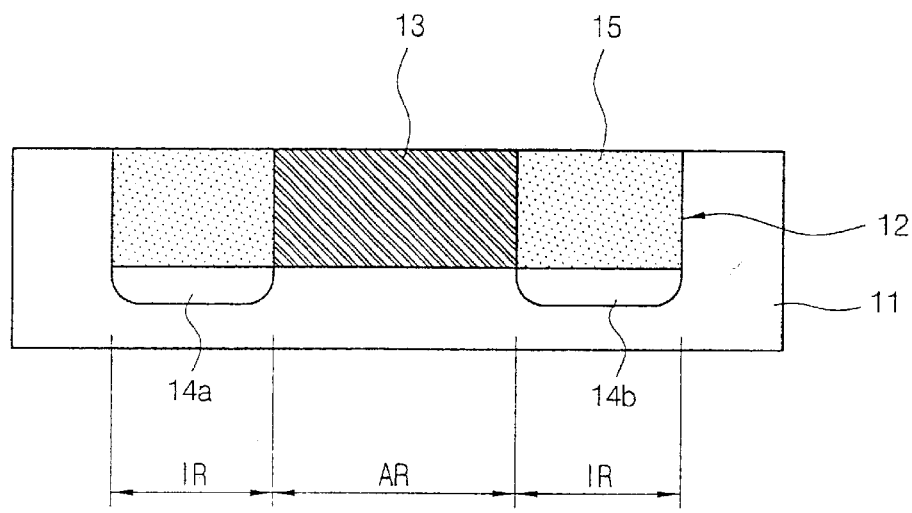
FIGS. 8A to 8D are cross-sectional views showing a fabrication method for a flash memory device according to an embodiment of the present invention.

Referring to FIG. 8A, a first trench 12 is formed on a predetermined position of a semiconductor substrate 11 to have a width including that of an active region AR and isolation regions IR at either side thereof. In order to define a gate formation region, an amorphous silicon layer 13 is deposited as a sacrificial layer to fill up the first trench 12, and then the amorphous silicon layer 13 is etched to expose the isolation region IR of the first trench 12.

Predetermined conductive type impurity ions are implanted into the exposed isolation region IR, without using an ion implantation mask, by blanket junction implant, and then source and drain regions 14a, 14b are formed in the exposed substrate region by performing a thermal process on the resulting substrate. A silicon nitride layer is deposited to fill up the isolation region IR of the first trench, thereby obtaining a trench type isolation layer 15.

Figure 8B:
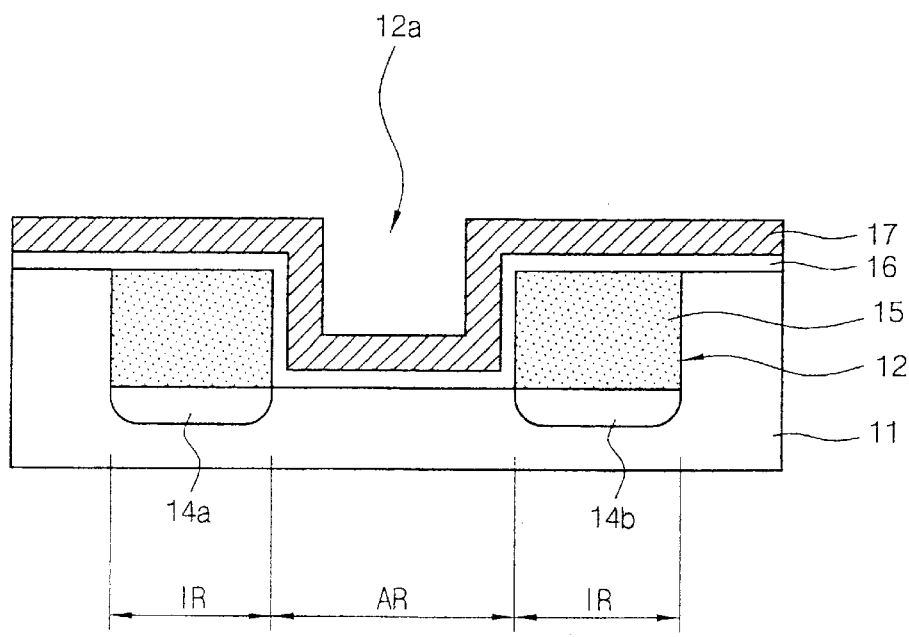

Referring to FIG. 8B, the amorphous silicon layer is removed to expose the active region AR by wet etch using etching selectivity with the nitride layer, thereby forming a second trench 12a reduced to expose only active region AR. Herein, the amorphous silicon layer functions to define only the active region, that is, a gate formative region. Therefore, other materials having etching selectivity with the nitride layer may also be used instead of the amorphous silicon layer.

An impurity for threshold voltage control is implanted into the exposed active region AR by the second trench 12a. A thin tunnel oxide layer 16 and a first polysilicon layer 17 for floating gate are sequentially deposited on the surface of the second trench 12a, on the isolation layer 15 and on the substrate 11.

Figure 8C:
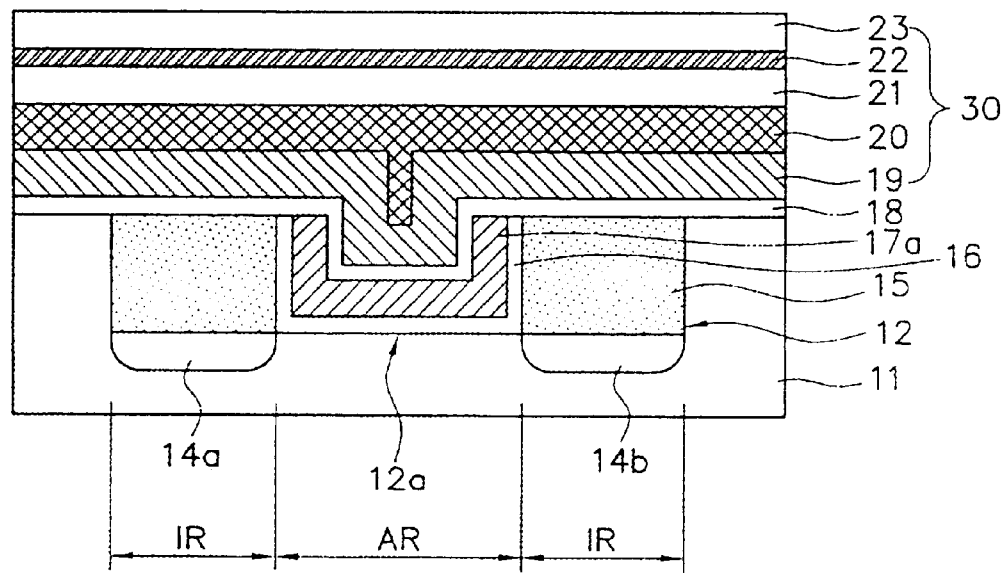

Referring to FIG. 8C, the first polysilicon layer 17 and the tunnel oxide layer 16 are polished to expose the substrate 11 in accordance with Chemical Mechanical Polishing (CMP) process, thereby forming a floating gate 17a having the shape of a groove. An ONO layer 18 is deposited on the resulting structure, and then the portion of ONO layer deposited on the cell region is selectively etched. A second polysilicon layer 19 for control gate is deposited on the ONO layer 18 to have a uniform thickness and a tungsten silicide layer 20 is deposited on the second polysilicon layer 19 to completely fill the second trench 12a. A TEOS oxide layer 21, a nitride layer 22 and an anti-reflective coating layer 23 are sequentially deposited on the tungsten silicide layer 20.

Figure 8D:
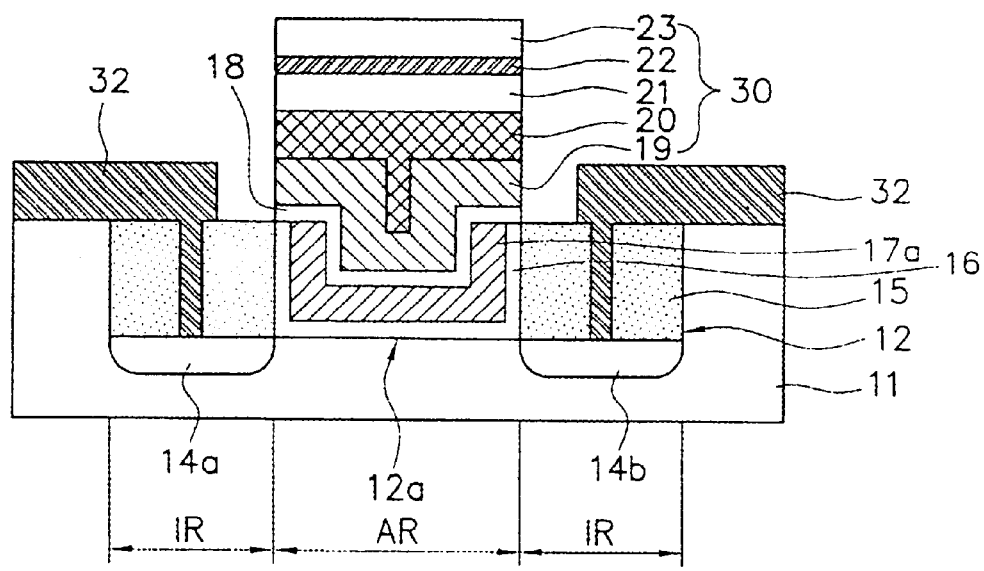

Referring to FIG. 8D, the anti-reflective coating layer 23, the nitride layer 22, the TEOS oxide layer 21, the tungsten silicide layer 20 and the second polysilicon layer 19 are patterned by using SAE process, thereby forming a control gate 30 having a line form. Metal wirings 32 are formed on the substrate 11 so as to be in contact with the source and drain regions 14a, 14b, respectively, through the isolation layer 15 by using well-known contact plug formation process, metal layer deposition process and etch process.

As described above, according to the present invention, the contact area between the floating gate and the control gate is increased as compared with a conventional gate structure having a simple stack structure, since the floating gate has the shape of a groove. Therefore, the flash memory device according to the present invention has an improved cell gate capacitive coupling ratio, thereby improving programming and erasing properties.

Although the preferred embodiment of this invention has been disclosed for illustrative purpose, those skilled in the art will appreciate that various modifications, additions and substitutions are possible, without departing from the scope and spirit of the invention.

What is claimed is:

1. A method of fabricating a flash memory device comprising the steps of:

forming a first trench having a width including an active region and an isolation region at each side thereof on a predetermined position of a semiconductor substrate;

filling up a sacrificial layer in the first trench;

patterning the sacrificial layer to expose the isolation regions of the first trench;

forming a source region and a drain region by implanting a predetermined conductive type impurity ions into the exposed first trench regions;

forming an isolation layer by filling up an insulating layer in the exposed first trench regions;

removing the patterned sacrificial layer to form a second trench exposing the active region;

forming a tunnel oxide layer and a floating gate sequentially on a surface of the second trench;

forming a control gate with a gate insulating layer interposed on the floating gate and the substrate; and forming metal wirings to be in contact with the source and the drain regions, respectively, through the isolation layer on the substrate.

2. The method of fabricating a flash memory device according to claim 1, wherein the sacrificial layer is an amorphous silicon layer.

3. The method of fabricating a flash memory device according to claim 1, wherein the step of forming the source and the drain regions is performed by blanket junction implant without using an ion implantation mask.

4. The method of fabricating a flash memory device according to claim 1, wherein the insulating layer is a silicon nitride layer (SiON).

5. The method of fabricating a flash memory device according to claim 1, wherein the step of removing the patterned sacrificial layer to form the second trench is performed by a wet etching using etching selectivity with the nitride layer.

6. The method of fabricating a flash memory device according to claim 1, further comprising, in between the step of forming the second trench and the step of forming the floating gate, the step of performing an implant for threshold voltage control on the exposed active region.

7. The method of fabricating a flash memory device according to claim 1, wherein the step of forming the tunnel oxide layer and the floating gate comprises the steps of:

depositing an oxide layer and a polysilicon layer sequentially on the surface of the second trench, the isolation layer and the substrate; and polishing the polysilicon layer and the oxide layer to expose the substrate.

8. The method of fabricating a flash memory device according to claim 1, wherein the gate insulating layer is an ONO layer.

9. The method of fabricating a flash memory device according to claim 1, wherein the step of forming the control gate comprises the steps of:

depositing a gate insulating layer, a polysilicon layer, a tungsten silicide layer, a TEOS oxide layer, a nitride layer and an anti-reflective coating layer sequentially over the substrate including the floating gate; and patterning the layers formed in the previous step in a line form extended one-way.

* * * * *